US007016421B2

(12) United States Patent
Yap et al.

(10) Patent No.: US 7,016,421 B2
(45) Date of Patent: *Mar. 21, 2006

(54) TIME-INTERLEAVED DELTA SIGMA ANALOG TO DIGITAL MODULATOR

(75) Inventors: Daniel Yap, Thousand Oaks, CA (US); Joseph F. Jensen, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 374 days.

This patent is subject to a terminal disclaimer.

(21) Appl. No.: 10/280,416

(22) Filed: Oct. 25, 2002

(65) Prior Publication Data

US 2003/0091116 A1    May 15, 2003

Related U.S. Application Data

(60) Provisional application No. 60/332,373, filed on Nov. 15, 2001.

(51) Int. Cl.
   *H04B 14/06* (2006.01)
(52) U.S. Cl. .................... 375/247; 341/137; 341/143; 341/144
(58) Field of Classification Search ............ 375/247; 341/143, 118, 120, 137, 144, 155
   See application file for complete search history.

(56) References Cited

U.S. PATENT DOCUMENTS

| 3,516,728 A | | 6/1970 | Fenner .................. 350/160 |
| 5,010,346 A | | 4/1991 | Hamilton et al. ........... 341/137 |
| 5,027,120 A | * | 6/1991 | Thurston .................. 341/143 |
| 5,111,517 A | | 5/1992 | Riviere .................... 385/11 |
| 5,142,286 A | | 8/1992 | Ribner et al. ............. 341/143 |
| 5,196,852 A | | 3/1993 | Galton .................... 341/143 |
| 5,253,309 A | | 10/1993 | Nazarathy et al. ............ 385/4 |
| 5,565,867 A | | 10/1996 | Tiemann .................. 341/143 |
| 5,621,408 A | * | 4/1997 | Cake et al. ............... 341/143 |
| 5,936,562 A | * | 8/1999 | Brooks et al. ............. 341/143 |
| 5,955,875 A | | 9/1999 | Twichell et al. ............ 324/96 |
| 6,218,972 B1 | | 4/2001 | Groshong ................. 341/143 |
| 6,246,350 B1 | | 6/2001 | Yap ...................... 341/137 |
| 6,259,389 B1 | | 7/2001 | McGrath .................. 341/120 |
| 6,326,910 B1 | | 12/2001 | Hayduck et al. ........... 341/137 |
| 6,422,985 B1 | | 7/2002 | Heitmann .................. 492/16 |
| 6,525,682 B1 | * | 2/2003 | Yap et al. ................ 341/137 |
| 6,781,533 B1 | * | 8/2004 | Yap et al. ................ 341/143 |

OTHER PUBLICATIONS

Juodawlkis et al., Optically Sampled Analog-toDigital Converters, IEEE Transactions on Microwave theory and techniques, vol. 49, No. 10, Oct. 2001, pp. 1840-1853.*

Clark, T.R., "Performance of a Time- and Wavelength-Interleaved Photonic Sampler for Analog-Digital Conversion," *IEEE Photonics Technology Letters*, vol. 11, No. 9, pp 1168-1170 (Sep. 1999).

Schiller, C., "A 4-GHz 8-b ADC System," *IEEE Journal of Solid-State Circuits*, vol. 26, No. 12, pp 1781-1789 (Dec. 1991).

(Continued)

*Primary Examiner*—Shuwang Liu
(74) *Attorney, Agent, or Firm*—Ladas & Parry LLP

(57) ABSTRACT

A Delta-Sigma Analog-to-Digital Converter (ADC) that can have a very high sampling rate (over 100 GHz) and which is preferably optically sampled to help achieve its very high sampling rate. The sampling rate can be many times higher than the regeneration speed of the electronic quantizers used in the ADC.

65 Claims, 7 Drawing Sheets

OTHER PUBLICATIONS

Bushshan, A.S. et al., "Time-Stretched Analogue-to-Digital Conversion," *Electronics Letters,* vol. 34, No. 11, pp. 1081-1083 (May 28, 1998).

Shoop, Barry L., et al., "High Resolution Optical A/D Conversion Using Oversampling and Interpolative Coding," *Signal, Systems, and Computers,* Twenty-Fifth IEEE Asilomar Conference, Los Alamitos, California, pp. 613-617 (1991).

Yariv, A., et al., "Time Interleaved Optical Sampling for Ultra-High Speed A/D Conversion," *Electronics Letters,* vol. 34, No. 21, pp. 2012-2013 (Oct. 15, 1998).

Zhang, Yikui, et al., "Higher Order Delta-Sigma AD Converter With Optimized Stable Coefficients," *IEICE Transactions On Fundamentals Of Electronics,* vol. E84-A, No. 3, pp. 813-819 (Mar. 3, 2001).

Bridges, W.B., et al., "Distortion in Linearized Electrooptic Modulators," *IEEE Transactions on Microwave Theory and Techniques,* vol. 43, No. 9, pp 2184-2197 (Sep. 1995).

Galton, I., et al., "Delta-Sigma Modulator Based A/D Conversion without Oversampling," *IEEE Transactions on Circuits and Systems—II: Analog and Digital Signal Processing,* vol. 42, No. 12, pp 773-784 (Dec. 1995).

Jenson, J.F., et al., "A 3.2-Ghz Second-Order Delta-Sigma Modulator Implemented in InP HBT Technology," *IEEE Journal of Solid-State Circuits,* vol. 30, No. 10, pp 1119-1127 (Oct. 1995).

Korotky, S.K., et al., "Dual Parallel Modulation Schemes for Low-Distortion Analog Optical Transmission," *IEEE Journal on Selected Areas in Communications,* vol. 8, No. 7, pp 1377-1381 (Sep. 1990).

Pace, P.E., et al., "Fiber Lattice Accumulator Design Considerations for Optical ΣΔDigital Antennas," Naval PostGraduate School, 10 pages total.

Pace, P.E., et al., "Integrated Optical Sigma-Delta Modulators," *Opt. Eng.,* vol. 35, No. 7, pp 1828-1836 (Jul. 1996).

Pace, P.E., et al., "Photonic Sampling of RF and Microwave Signals," Naval PostGraduate School, Sections 9.3-9.4, pp 35-56 (Mar. 16, 1998).

U.S. Appl. No. 10/281,331, filed Oct. 25, 2002, Yap et al.

\* cited by examiner

TIME-INTERLEAVED DELTA SIGMA ANALOG TO DIGITAL MODULATOR

CROSS REFERENCE TO RELATED APPLICATIONS

This application claims the benefit of U.S. Provisional Patent Application Ser. No. 60/332,373 filed Nov. 15, 2001 for an "Time-Interleaved Delta Sigma Analog to Digital Modulator" by Daniel Yap and, the disclosure of which is hereby incorporated herein by reference.

This application is related to commonly owned U.S. Pat. No. 6,781,533 entitled "Optically Sampled Delta-Sigma Modulator" filed simultaneously herewith and its corresponding U.S. Provisional Patent Application Ser. No. 60/332,369 filed on Nov. 15, 2001, the disclosure of which is hereby incorporated herein by reference.

STATEMENT OF GOVERNMENT INTEREST

This invention was related to work performed under the government contract entitled "Photonic Analog to Digital Conversion Technology (PACT) from DARPA". The government has certain rights in this invention.

TECHNICAL FIELD

This invention relates to a Delta-Sigma Analog-to-Digital Converter (ADC) that can have a very high sampling rate (over 100 GHz) and which is preferably optically sampled to help achieve its very high sampling rate. The sampling rate can be many times higher than the regeneration speed of the electronic quantizers used in the loop(s) in the Delta-Sigma ADC.

BACKGROUND OF THE INVENTION

Disclosed is a Delta-Sigma Analog-to-Digital Converter (ADC) that has a very high sampling rate (over 100 GHz) and which is preferably optically sampled. The sampling rate can be many times higher than the regeneration speed of its individual electronic quantizers by using multiple quantizers in a single Delta-Sigma feedback loop. These multiple quantizers are addressed in a time-interleaved manner, with each quantizer handling only a subset of the sampled input pulses. For an embodiment with N time-interleaved quantizers, the clock speed of the individual quantizers can be 1/N times the sampling rate. Time-interleaved sampled pulses are generated by one or more samplers, which are preferably photonic or optoelectronic samplers, located within the Delta-Sigma loop. The output of Digital-to-Analog Convertors (DACs) in the Delta-Sigma loop are sampled, or gated, preferably by means of optical pulses. The multiple DAC outputs are combined to produce the Delta-Sigma feedback signal.

With this approach, the oversampling ratio can be substantially higher than that which is achievable with prior art Delta-Sigma ADCs. The Delta-Sigma approach disclosed herein derives a superlinear benefit from such oversampling and thus the resolution of this ADC system is increased greatly. With this approach, the analog summing points and the integrators function as continuous-time elements. Since, with continuous-time integrators, the sampling speed is not dependent on the speed of the transistors in the integrators, the ADC can accommodate analog inputs of very high frequencies (over 10 GHz for example). The quantizer and DAC, however, can be considered as discrete-time elements, which is one result of using optoelectronic sampling. This approach also can be applied to high-order Delta-Sigma designs.

Ultra-short and stable optical pulses and photonic or optoelectronic samplers are preferably used to accomplish the sampling. Optical sampling pulses are preferably coded according to their wavelength using a known method. One or more optical wavelength-division multiplexing splitters and associated time delay elements can be used to select and sequence the sampling or sampled pulses for each of the quantizers and gating pulses for each of the DACs.

The response of an electronic ADC can be limited by the regeneration time of its comparators/quantizers. Even for a quantizer with very fast transistors having a $f_T$ of 200 GHz, for example, only moderate ADC resolution can be achieved at 10 GSPS rates. Optical sampling is preferred because optical sampling makes use of ultrashort laser pulses with high temporal stability to sample an analog electrical input. Picosecond sampling or aperture windows and sampling-pulse repetition rates of 100 GHz can be achieved with optical sampling. The sampled pulses are time-interleaved among multiple quantizers within a single Delta-Sigma ADC. For example, the Delta-Sigma loop may have ten quantizers, each operating at a clock speed of 10 GSPS. However, the analog difference signal produced by the Delta-Sigma loop is sampled at a rate of 100 GSPS. Thus, the oversampling ratio is determined by the 100 GSPS value. Yet the quantizers only need to operate at rates of 10 GSPS in such an embodiment (with ten quantizers in the loop), and thus the quantizers can be implemented electronically using fast transistors.

This approach to time interleaving is superior to prior time-interleaved approaches that optically sample an analog input and then interleave those samples among independent quantizers. A time-interleaved system based on optical sampling is described in Hamilton and Bell's U.S. Pat. No. 5,010,346. In the present case, all of the quantizers are part of the same Delta-Sigma loop. Thus, they are not independent since their combined outputs provide the difference signal fed back through the Delta-Sigma loop. It is the "delta-sigma" signal that is sampled and time interleaved. This coupling of the Delta-Sigma quantizers achieves greatly improved ADC resolution since a high-order noise filter in the Delta-Sigma loop produces a super-linear improvement in the signal-to-noise ratio.

The disclosed invention makes use of the concepts and components described in the optically sampled analog-to-digital converter (ADC) system disclosed in U.S. Pat. No. 6,781,533 entitled "Optically Sampled Delta-Sigma Modulator" mentioned above. The ADC architecture of this related application incorporates the optoelectronic sampler following the analog integrator and within the loop of a delta-sigma modulator. The noise resulting from the sampler and the spurs generated by the non-linear response of that sampler are thus suppressed by the noise-spectrum shaping and digital filtering. Thus, the resolution (as determined by the signal-to-noise and spur free dynamic range) is improved over what can be achieved with a conventional combination of optical sampling with separate electronic ADC. The ADC architecture disclosed herein can provide additional benefits.

Analog-to-digital converters that are capable of both large bandwidth and high resolution are needed for many applications. Such capability can enhance the capabilities of digital receivers, for example. Such ADCs may even make possible the direct analog to digital conversion of high frequency signals. Thus, one can avoid the complexity and size associated with needing multiple stages of analog frequency conversion prior to the analog to digital conversion in such equipment.

FIG. 1 illustrates the optically sampled Delta-Sigma ADC system disclosed in U.S. Pat. No. 6,781,533 entitled "Optically Sampled Delta-Sigma Modulator" mentioned above. This ADC system includes a delta-sigma modulator loop 100 and a subsequent digital filter 102. A continuous-time analog input signal X(t) is applied to the input node of a delta-sigma modulator loop 100. At the input node, the feedback signal $Y_a(i)$ from the loop (an analog representation of the quantized output) is subtracted from the analog input signal at junction 104. The difference signal $X_d(t)$ is then integrated (for a first-order delta-sigma modulator) by integrator 108, the integrator 108 may also be referred to as a feed forward loop filter. The output $X_f(t)$ of the integrator 122 is sampled by the optoelectronic sampler 110. The optoelectronic sampler 110 is controlled by an impulse source 112 to produce a short electrical pulse, and if desired also a short optical pulse, whose amplitudes are determined by the output level (or voltage) of the integrator 108. This short pulse can be optionally broadened by a pulse broadener 114 comprised of, for example, a filter or another integrator. The quantizer 116 compares the peak value of this pulse with a predetermined threshold value and outputs a digital "one" or "zero" according to that comparison (for a 1 bit quantizer). The digital output stream Y(i) from the quantizer 116 is then processed by the digital filter 102 and, usually, a decimator (not shown). The digital output stream Y(i) at the output node of the deltasigma modulator loop also is directed to a feedback path in which it is converted back to an analog signal by a DAC 118 and, possibly, low-pass filtered by a low pass filter 119 to produce feedback signal $Y_a(i)$. The feedback signal $Y_a(i)$ is subtracted from a later portion of the analog input signal X(t).

The optoelectronic sampler 110 in both the related patent application referred to above and the present patent application is an element that accepts a first input 120 comprised of a sequence of optical pulses and a second input 122 comprised of an analog electrical waveform ($X_f(t)$ in FIG. 1). The output 124 of the sampler 110 is a sequence of electrical pulses whose amplitudes are determined by the values of the analog waveform at the instances that waveform concurs with the input optical pulses at input 120. The output of the sampler 110 must have at least as many distinguishable levels as needed for the particular design of the feed forward loop. In many cases, only two distinct output levels are needed (that is, a one bit quantizer is suitable in such embodiment). Several possible embodiments of such an optoelectronic sampler 110 are described in the related patent application referenced above and reference may be had to that patent application for the details relating to their construction. Such combined electroabsorption and photodetection devices 110 accommodate very short optical pulses, of even sub-picosecond widths. In addition to the electrical output, the disclosed electroabsorption device 110 also can have an optical output that is a short optical pulse whose amplitude is determined by the analog input voltage. That output pulse likewise can be used as an optical sampled signal that can be photodetected to produce an electrical sampled signal. The electroabsorption device is called, in this patent application, a photonic sampler when its optical output is used or an optoelectronic sampler when its electrical output is used.

In the approach disclosed in the related patent application, the clock speed of the quantizer, and thus the sampling rate of the ADC, is limited by the regeneration time of the comparator circuit in the quantizer 116. Note that the comparator regeneration time is inversely proportional to the $f_T$ of the transistors used in the comparator circuit. Even when fast transistor technology is used, such as InP-based HBTs, the comparator-limited sampling rate would be only slightly higher than 10 GSPS.

With optical sampling, the sampling aperture (temporal width) of the ADC is determined by the width of the input optical sampling pulses rather than by the decision time of the quantizer. The optical pulses can have widths of a few picoseconds ($10^{-12}$ seconds). The sampled pulses can then be stretched in time by means of a pulse-broadening filter 114 so that the frequency content seen by the quantizer can be much lower.

The present invention achieves a net sampling rate that is higher than the quantizer clock rate by time-interleaving the sampled pulses among several parallel comparators and digital-to-analog converters (DAC) located within a delta-sigma loop. This invention also provides a means to combine the multiple DAC outputs at the summing junctions of the delta-sigma loop.

Time interleaving of discrete-time sampled pulses among multiple analog-to-digital converters has been described in prior work. In these prior systems, the time-interleaved quantizers are operated as distinct, uncoupled analog-to-digital converters. In contrast, the present invention couples its time-interleaved quantizers within the same Delta-Sigma loop.

A prior art system based on electronic sampling is described by Schiller and Byrne in IEEE Journal of Solid-State Circuits, vol. 26, no. 12, pp. 1781–1789 (1991). This system is illustrated in FIG. 2a. The analog input signal is sampled by multiple electronic samplers. The time interleaving is achieved by phase shifting the timing clock waveforms that are delivered to the multiple electronic samplers. The output of each sampler is directed to a different analog-to-digital converter (ADC) after that output is broadened by means of a low-pass filter.

Various prior methods to encode and time-interleave the optical pulses have been proposed and demonstrated. According to one method, the optical sampling pulses are encoded so that they have different wavelengths. One example of wavelength-encoded, time-interleaving is illustrated in FIG. 2b and is described by Clark et al. in IEEE Photonics Technology Letters, vol. 11, no. 9, pp. 1168–1170 (1999). According to this approach, spectrally broad pulses from a mode-locked laser are sliced by a wavelength-division multiplexer into N discrete wavelength channels. Each wavelength slice is itself an optical pulse. These wavelength-encoded pulses are then delayed by different time durations. The result is a series of N optical pulses for which each successive pulse has a different wavelength. This series repeats at the repetition rate of the mode-locked laser. In this way, the repetition rate of the optical sampling pulses can be N times greater than the repetition rate of the mode-locked laser. After the optical sampling, the sampled pulses are selected by means of a second wavelength-division multiplexer. Like the other prior art, the wavelength selected, time-interleaved sampled pulses are then distributed among a group of uncoupled analog-to-digital converters.

An electronic delta-sigma analog-to-digital converter with time-interleaved quantizers has been described in U.S. Pat. No. 5,621,408. This approach makes use of electronic sampling that occurs effectively at the multiple quantizers that are located within a single delta-sigma loop. In one embodiment, the outputs from the multiple quantizers are switched so that they sequentially control a single digital-to-analog converter of the loop. In another embodiment, the outputs of the quantizers are directed to multiple digital-to-analog converters. The outputs of those DACs are switched by means of electronic switches. In contrast to this prior art approach, the present invention provides a way to use a single, higher-speed sampler with multiple quantizers of lower-speed. The present invention makes use of optical sampling pulses to achieve much higher sampling rates and much narrower sampling apertures. Also, optically controlled samplers or gates, appropriately delayed with respect to the sampler outputs, are used to activate the DAC outputs at the proper temporal instances.

SUMMARY OF THE INVENTION

A delta-sigma modulator comprising: a node which produces a difference signal equal to a difference in magnitude between a continuous time analog input signal having a frequency F and N feedback signals generated from N digital output signals, where N is an integer number greater than one; an integrator, coupled with the node, which integrates the difference signal and produces an integrated signal; a set of N detectors; a sampler, which samples the integrated signal and produces a sampled integrated signal; a signal splitter connected with the sampler for separating the sampled integrated signal into N different outputs, the outputs of the signal splitter being coupled with the set of N detectors to supply different detectors with different sampled integrated signals to different detectors; a set of N quantizers, each quantizer being coupled with one of said N detectors and having a frequency response less than F, but of at least F/N, the quantizers each quantizing at least a portion of the sampled integrated signal and the set of N quantizers collectively producing the N digital output signals; and a set of N digital to analog modulators for converting the N digital output signals to generate the N feedback signals applied to said node.

A delta-sigma modulator having N channels and being of a Yth order, with Y being an integer equal to or greater than one and N being an integer equal to or greater than 2, the modulator comprising: a set of Y node/integrator pairs connected in a series, the nodes of which produce a difference signal equal to the difference in magnitude between a continuous time analog input signal having a frequency F and N feedback signals generated from N digital output signals and the integrators of which are coupled with an associated node and integrate the difference signal from the associated node to produce an integrated signal for the associated node/integrator pair;

a set of N detectors; a sampler, which samples the integrated signal from a last node/integrator pair in said set and produces a sampled integrated signal; a signal splitter connected with the sampler for separating the sampled integrated signal into N different outputs, the outputs being coupled to the set of N detectors to supply different detectors with different sampled integrated signals; a set of N quantizers, each quantizer being coupled with one of said detectors and having a frequency response less than F, but of at least F/N, the quantizers each quantizing a portion of the sampled integrated signal and collectively producing the N digital output signals; and at least one set of N digital to analog converters for converting the N digital output signals to generate the N feedback signals to each of the Y nodes.

A delta-sigma modulator comprising: a node which produces a difference signal equal to the difference in magnitude between a continuous time analog input signal having a frequency F and N feedback signals generated from N digital output signals, where N is an integer larger than one; an integrator, coupled with the node, which integrates the difference signal and produces an integrated signal; a set of N optoelectronic samplers, which sample the integrated signal and produce a set of sampled integrated signals; a signal splitter connected to the set of N optoelectronic samplers, the signal splitter separating optical pulses supplied by an optical pulse generating device into N different outputs, the outputs being coupled with the set of N optoelectronic samplers to supply different samplers with different pulses; a set of N quantizers, each quantizer being coupled with one of said samplers and having a frequency response less than F, but of at least F/N, the set of N quantizers each quantizing one sampled integrated signal from the set of sampled integrated signals and collectively producing the N digital output signals; and a set of N digital to analog modulators for converting a respective digital output signal of said N digital output signals to one of said N feedback signals for application to the node.

A delta-sigma modulator having N channels and being of a Yth order, with Y being an integrator equal or greater than one and N being an integer equal to or greater than 2, the modulator comprising: a set of Y node/integrator pairs connected in a set, the nodes of which produce a difference signal equal to the difference in magnitude between a continuous time analog input signal having a frequency F and N feedback signals generated from N digital output signals and the integrators of which are coupled with an associated node and integrate the difference signal from the associated node to produce an integrated signal for a node/integrator pair; a set of N optoelectronic samplers each of which samples the integrated signal from a last node/integrator pair in said set and produces a sampled integrated signal; a signal splitter connected to the set of N optoelectronic samplers, the signal splitter for separating the optical pulses supplied by an optical pulse generating device into N different outputs, the outputs being coupled with at least the set of N optoelectronic samplers to supply different optoelectronic samplers with different pulses; a set of N quantizers, each quantizer being coupled with one of said samplers and having a frequency response less than F, but of at least F/N, the quantizers each quantizing a portion of the sampled integrated signal and said set of N quantizers collectively producing the N digital output signals; and at least one set of N digital to analog converters for converting a respective digital output signal from the N digital output signals into a corresponding one of said N feedback signals for application to each of said nodes.

A method for increasing a sampling rate of an optical delta-sigma modulator having at least one channel comprising the steps of: adding one or more channels to said optical delta-sigma modulator, wherein each channel comprises a photodetector, a quantizer connected with said photodetector and a digital to analog converter connected with said quantizer; addressing said channels in a time-interleaved manner such that each channel handles a subset of an input to said optical delta-sigma; and supplying an output of each of said channels to a first node.

photoconductive gate with each digital to analog converter in each of said channels.

A method for improving a delta-sigma modulator having at least one channel comprising the steps of: integrating an analog input signal prior to optically sampling said analog input signal to produce an optically sampled integrated signal; time-interleaving the optically sampled integrated signal among a plurality of channels; and combining an output of each of said plurality of channels into a first node.

A method of providing an improved optical delta-sigma modulator comprising the steps of: subtracting an analog signal and N feedback signals, said N feedback signals being generated from N channels to produce a first difference signal wherein N is an integer greater than or equal to two; integrating said first difference signal to produce an integrated signal; splitting said integrated signal into said N channels; optically sampling said integrated signal in each of said N channels to produce N optically sampled signals; quantizing each of said N optically sampled signals to produce N quantized signals; and generating said N feedback signals from said N quantized signals.

An optical delta-sigma modulator comprising: a set of N channels, wherein each channel comprises a photodetector, a quantizer connected with said photodetector and a digital to analog converter connected with said quantizer, each of said plurality of channels having an input and an output, wherein N is an integer greater than or equal to two; a splitter having a plurality of splitter outputs, said each of said plurality of splitter outputs coupled with an input of an associated channel from said set of N channels, said splitter for splitting an input to said optical delta-sigma modulator into said set of N channels such that each channel handles a subset of the input to said optical delta-sigma modulator; and a combiner connected with said outputs of said set of N channels for combining said subset of the input to said optical delta-sigma modulator.

DETAILED DESCRIPTION

Figure 3:
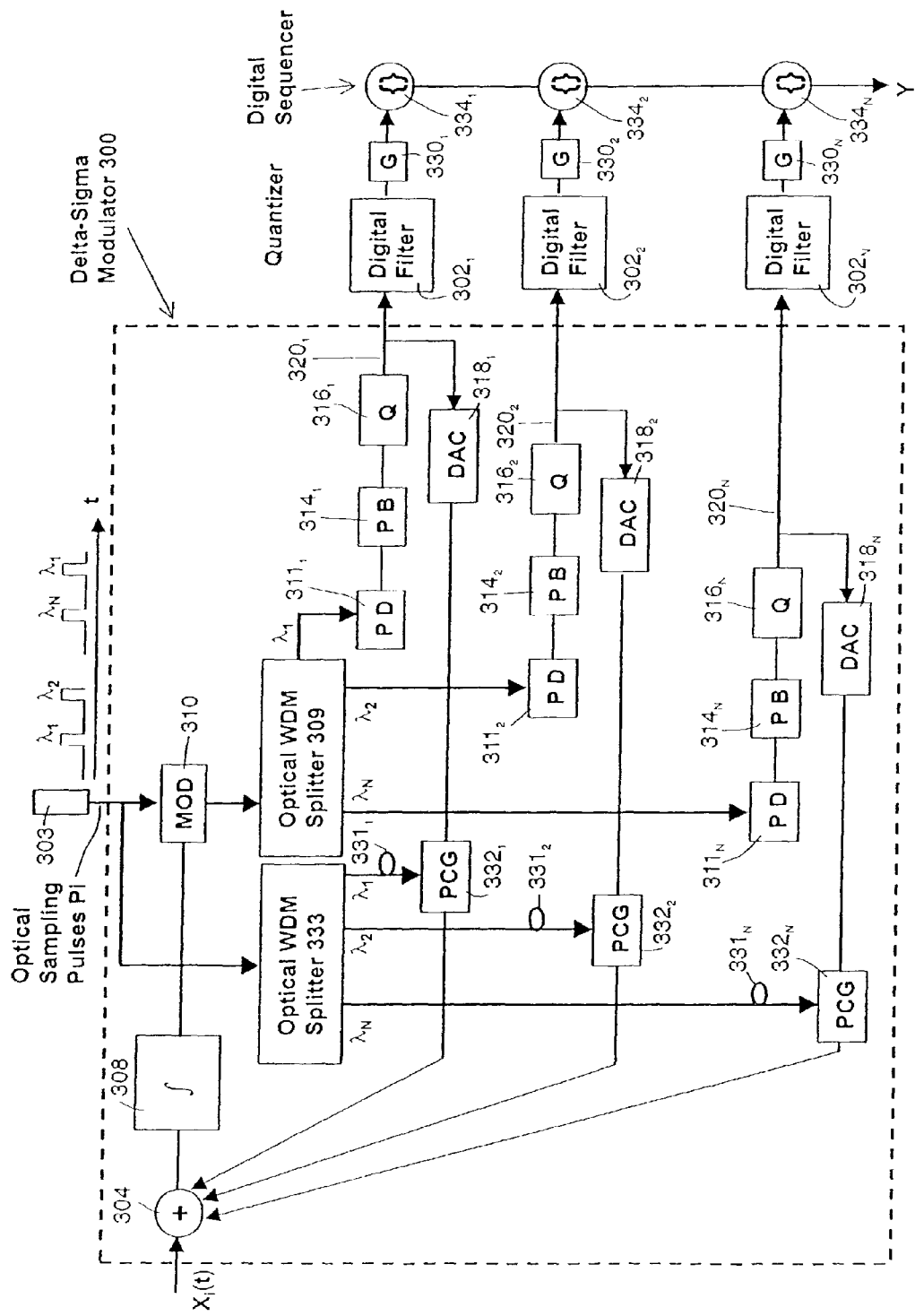
FIG. 3 illustrates one embodiment of the time-interleaved, delta-sigma analog-to-digital converter according to the present invention.

An embodiment of a time-interleaved, optically sampled analog-to-digital converter (ADC) system of the present invention is illustrated in FIG. 3. This ADC is comprised of a Delta-Sigma modulator 300 that has multiple digital output streams $320_1$–$320_N$ comprising N different digital data channels. Each of these digital output streams is produced from a different quantizer $316_1$–$316_N$. The outputs are then filtered and decimated by means of digital filters $302_1$–$302_N$ before they are combined to produce a digital representation $Y_1$ of the analog input signal $X_1(t)$. Each digital channel can optionally have a programmable gain element $330_1$–$330_N$ to adjust the gains of these channels.

The delta-sigma modulator of this embodiment has two inputs—an analog electrical signal input $X_i(t)$ and a set of wavelength encoded optical sampling pulses $P_i$ from, for example, a laser pulse generator 303 or any other optical pulse generating device. Successive sampling pulses have different wavelengths $\lambda_1$–$\lambda_N$. Each output channel of the delta-sigma modulator is associated with a different subset of the optical sampling pulses $P_i$, and they are distinguished according to the different wavelengths of those pulses. Thus, each output channel contains a bit stream that describes only a time-sliced subset of the analog input.

Figure 1:
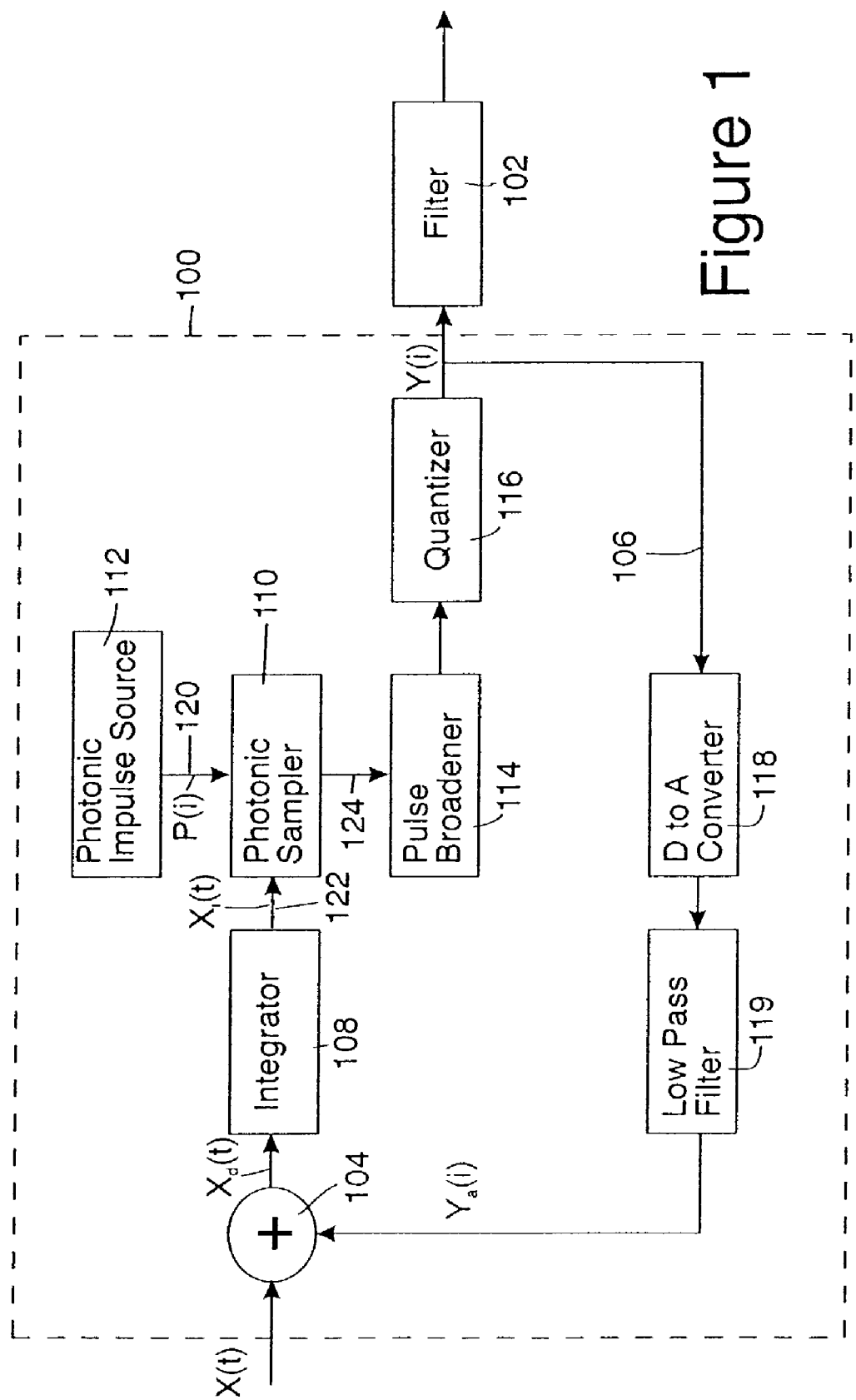
FIG. 1 illustrates one embodiment of a Delta-Sigma ADC in accordance with the invention of the related U.S. Pat. No. 6,781,533 noted above, the disclosure of which is incorporated herein by reference.

The delta-sigma modulators are sometimes called convertors and sometimes called modulators in the art. In FIG. 1, block 100 identifies the modulator while the modulator 100 plus the filter 102 can properly be referred to as the convertor. In FIG. 3, block 300 identifies the modulator while the modulator 300 plus the filters 302 and the summing node(s) 334 can properly be referred to collectively as the convertor. These terms, modulator and convertor, tend to be used rather loosely in the art and to a certain extent interchangeably.

The delta-sigma modulator has one set of analog summing nodes 304 and noise shaping filters (or integrators) 308. For a first-order delta-sigma design, such as the one shown in FIG. 3, the modulator has a single summing node 304 and a single integrator 308. Higher order delta-sigma modulators will have additional nodes 304 and integrators 308. The delta-sigma modulator of this embodiment also has multiple channels that are each comprised of a photodetector (PD) 311, a pulse-broadening filter (PB) 314, a quantizer (Q) 316, a digital-to-analog converter (DAC) 318, and a photoconductive gate (PCG) 332. Subscripts 1–N in FIG. 3 identify the particular channel with which the elements are associated. The feedback signals from the multiple channels at the outputs of the PCG $332_1$–$332_N$ are summed at the analog summing node 304. This combined feedback signal is subtracted from the analog input signal $X_i(t)$ at the summing node 304. The pulse-broadening filters (PB) $314_1$–$314_N$ spread out the lengths of the pulses somewhat to aid the quantizers $316_1$–$316_N$. The pulses are preferably still distinguishable after spreading, that is to say, the pulses preferably do not overlap after spreading by the pulse-broadening filters (PB) $314_1$–$314_N$. Integrators 308 generally speaking have a longer time constant or time spreading effect than do the pulse-broadening filters (PB) $314_1$–$314_N$.

The electrical output of the integrator 308 is an analog signal that needs to be quantized at specific instances of time. In a prior art electronic delta-sigma modulator, the quantizer performs a track and compare function. The comparison is done at an edge of the clock signal supplied to the quantizer. The maximum allowable sampling rate is determined by the regeneration time of the quantizer. It also is determined by the decision-making time required by the quantizer.

Figure 2A:
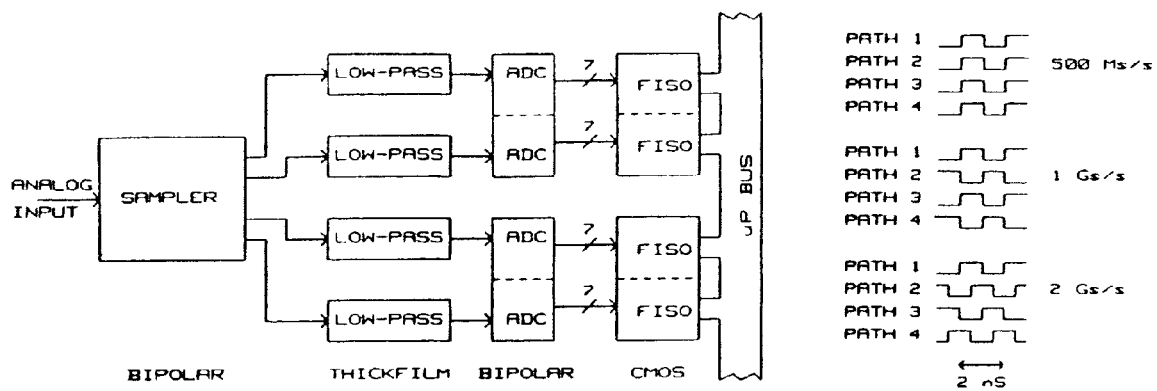
FIG. 2a illustrates a prior art time-interleaved ADC system based on interleaved sampling clocks.
Figure 2B:
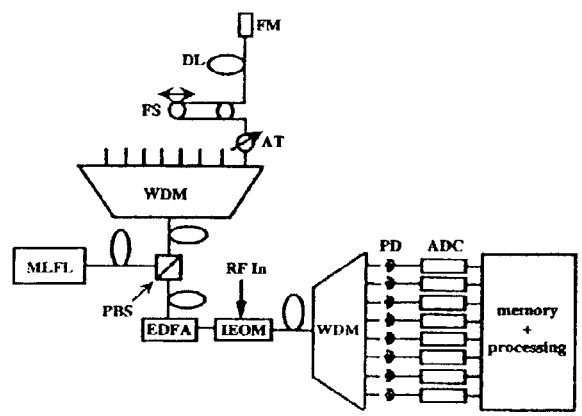
FIG. 2b illustrates a prior art system using wavelength selection to time-interleave a set of optically sampled pulses.

This embodiment preferably utilizes an optical modulator (MOD) as a photonic sampler 310. The optical modulator 310 could be an electroabsorption device, like the optoelectronic samplers of the related disclosure, or an electro-optic device, such as the samplers, for example, described in the prior-art documents noted above by Hamilton and Bell and by Clark et al. In this embodiment, a series of wavelength-encoded optical impulses $P_i$ from a laser pulse generator 303 is applied to the optical modulator 310. The laser pulse generator could be like the one described by Clark et al. and shown in FIG. 2b hereof. The analog electrical signal from the integrator 308 is applied to the electrode(s) of optical modulator 310. The optical input pulses sample the voltage on the modulator electrode(s). A wavelength-division-multiplexing (WDM) splitter (which may be more generically known as a pulse sequencer) 309 separates the resultant optical pulses, whose intensities are determined by the voltage from integrator 308 being applied to optical modulator 310, according to their optical wavelengths. The pulses of each given wavelength are fed to one set of photodetectors 311. Each photodetector $311_1$–$311_N$ is a member of a different channel of the delta-sigma modulator. The electrical output current of each photodetector 311 is broadened in time, reduced in spectral content, and is supplied as the discrete-time input to a channel-associated electronic quantizer 316.

Each quantizer $316_1$–$316_N$ evaluates only a time-sliced subset of the analog waveform output from the integrator 308. The digital output of each quantizer $316_1$–$316_N$ is valid during its associated time slice. That digital output of each quantizer $316_1$–$316_N$ is converted to an analog signal by a channel-associated digital-to-analog converter (DAC) $318_1$–$318_N$, the outputs of each of which may be valid only at specific times. The wavelength-encoded optical sampling pulses also are used to sample the DAC outputs at the times when those outputs are valid. This sampling of the DAC output for each channel is preferably done by means of the aforementioned photoconductive gates 332. The photoconductive gates $332_1$–$332_N$ associated with each channel passes the output of the associated DAC $318_1$–$318_N$ only during the instance when the channel-associated optical sampling pulse closes the associated gate $332_1$–$332_N$. Thus, the photoconductive gate $332_1$–$332_N$ are controlled by the optical sampling pulse. Essentially, an electrical charge that corresponds to the DAC output value is then supplied to the analog summing node 304. The continuous-time summing node 304 can readily sum the various packets of charge that are delivered to it from the various gated DAC outputs. A second WDM splitter 333 is used to select the appropriate optical gating pulse for each channel. Optical delay lines, indicated by the loops $331_1$–$331_N$, provide the appropriate temporal delays so that the optical gating pulse is delivered to the associated photoconductive gate $332_1$–$332_N$ when the DAC output associated with the gate is valid.

With this parallel approach, it is important to ensure that the sampling pulses $P_i$ have the same energy, otherwise, the performance of the parallel delta-sigma ADC channels will degrade. Similarly, it is important to match the characteristics of the multiple quantizers 316. Mismatches between the sampling pulse energies and the quantizer sensitivities for different channels can result in offset errors that could produce spurious tones in the digital signal. In some embodiments it may be desirable to give some sampled pulses more importance than other sampled pulses. This weighting can be accomplished by means of the digital gain cells $330_1$–$330_N$ which can be programmed to adjust the relative gains of the channels.

The digital output streams from the multiple Delta-Sigma modulator channels resemble the bit streams that would be produced if a single-output Delta-Sigma modulator were passed through a 1-to N demultiplexer. The effect of the demultiplexer is to slow down the data rate. Known methods have been developed using multiple parallel computers to process such demultiplexed outputs from fast Delta-Sigma modulators. One advantage of the present time-interleaved Delta-Sigma modulator is that its output stream already has been demultiplexed into multiple output channels. The outputs of each channel (whether produced by a demultiplexer or by the time-interleaved Delta-Sigma modulator) are phase shifted and essentially partially decimated. The digital filters $302_1$–$302_N$ and the digital sequencers $334_1$–$334_N$ shown in FIG. 3 and in the various other embodiments of the present invention are indicative of the need for filtering, decimating and sequencing functions. They are not intended to suggest any particular implementation of those functions. Various known designs, such as those involving polyphase decimator, polyphase filters and tapped delay lines could be used for these implementations.

The width of the photodetector output pulses can be somewhat greater than the width of the optical input pulses, because of capacitances in the photodetector structure or other effects. These pulses can be intentionally made even wider still by passing them through an analog pulse-broadening filter 314. Having a wider pulse relaxes the timing requirement on the clock of the subsequent comparator/quantizer 316. The maximum pulse width is limited by a requirement that successive pulses should not overlap. Thus, this maximum width is determined by 1/N times the sampling rate, where N is the number of channels. The photonic sampler 310 and photodetector 311 combination produces a current or voltage that can be evaluated by the comparators/quantizer $316_1$–$316_N$. Since the quantizer 316 may have a resolution of only one or several bits, the photonic sampler 310 likewise can have low resolution.

The delta-sigma modulator of the present invention shapes the noise spectrum by decreasing the noise power within the signal band and increasing the noise power outside of that band. This noise power could be due to quantization noise, other noise sources in the comparator, noise sources in the sampler or sampling-pulse generator, or spurs added by the sampler. In fact, the noise-spectrum shaping will apply to any noise or spur content that is added by elements of the ADC system which are located between the integrator 308 and the feedback node, the analog summing node 304. The degree of noise-spectrum shaping depends on the order of the delta-sigma modulator loop. The operation of a first-order modulator has been described with reference to FIG. 3. Delta-sigma modulators of higher order could be achieved with the approach disclosed herein by employing higher-order continuous-time integration before the photonic sampler 310.

Delta-sigma modulators use oversampling and noise shaping to remove the quantization and sampling noise from the baseband to higher frequencies. Oversampling evenly distributes this noise over the frequency range from DC to half the sampling frequency, thereby improving the noise of the delta-sigma modulator by 3 dB per octave (or doubling) of the oversampling rate. Adding integrators in the feedback path results in high-pass filtering of the noise. Each integrator in the feedback path, i.e. each additional order of the delta-sigma loop, improves the signal-to-noise (SNR) ratio by an additional 6 dB per octave of oversampling. With both oversampling and filtering, a first-order modulator produces 9 dB of noise reduction per octave of oversampling and a second-order modulator produces 15 dB, per octave of oversampling. Each 6 dB improvement in SNR corresponds to approximately one additional bit of ADC resolution.

Figure 4:
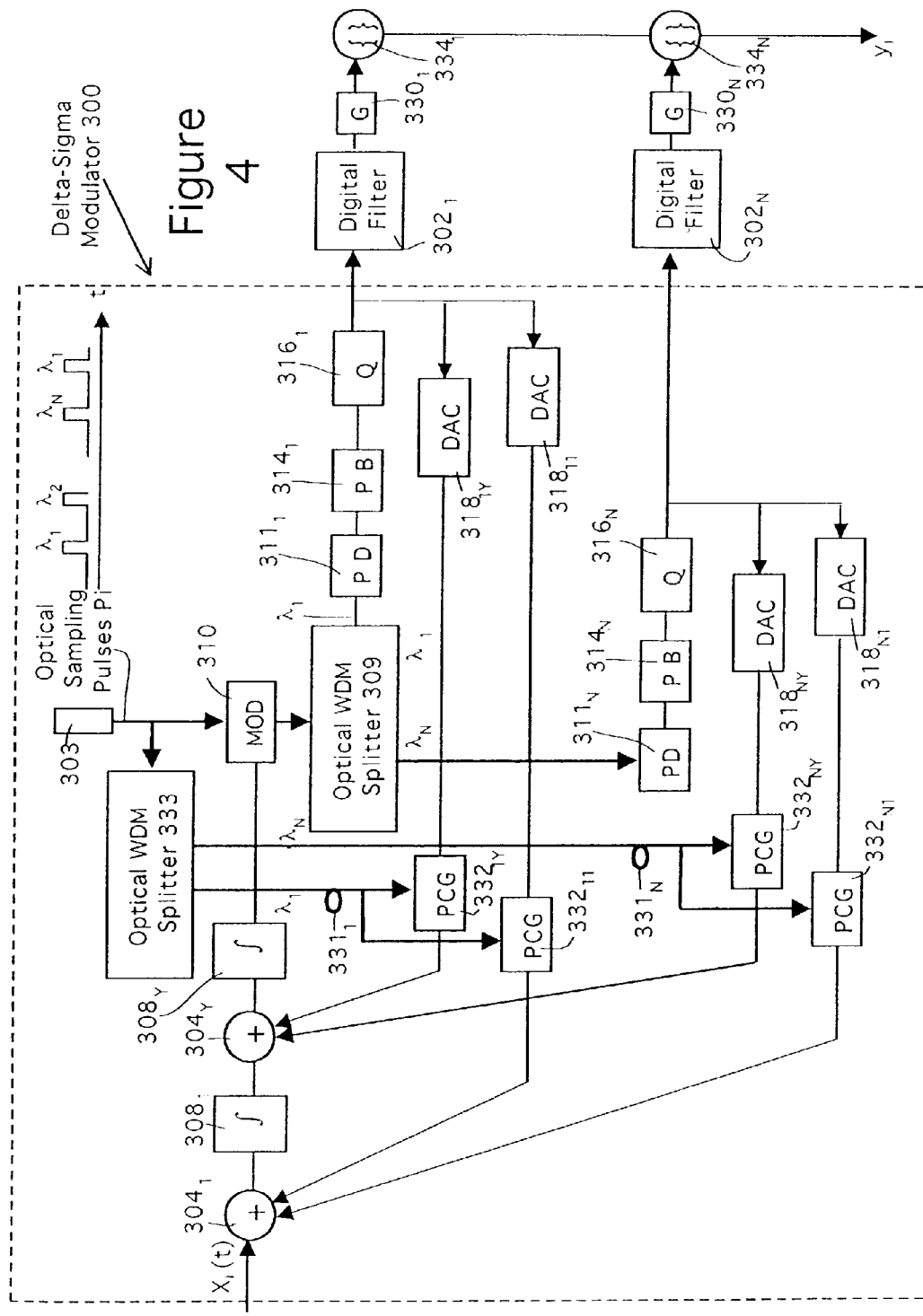
FIG. 4 illustrates another embodiment of the time-interleaved, delta-sigma analog-to-digital converter according to the present invention, this embodiment having a higher order (Y-order), time-interleaved, delta-sigma ADC.
Figure 4A:
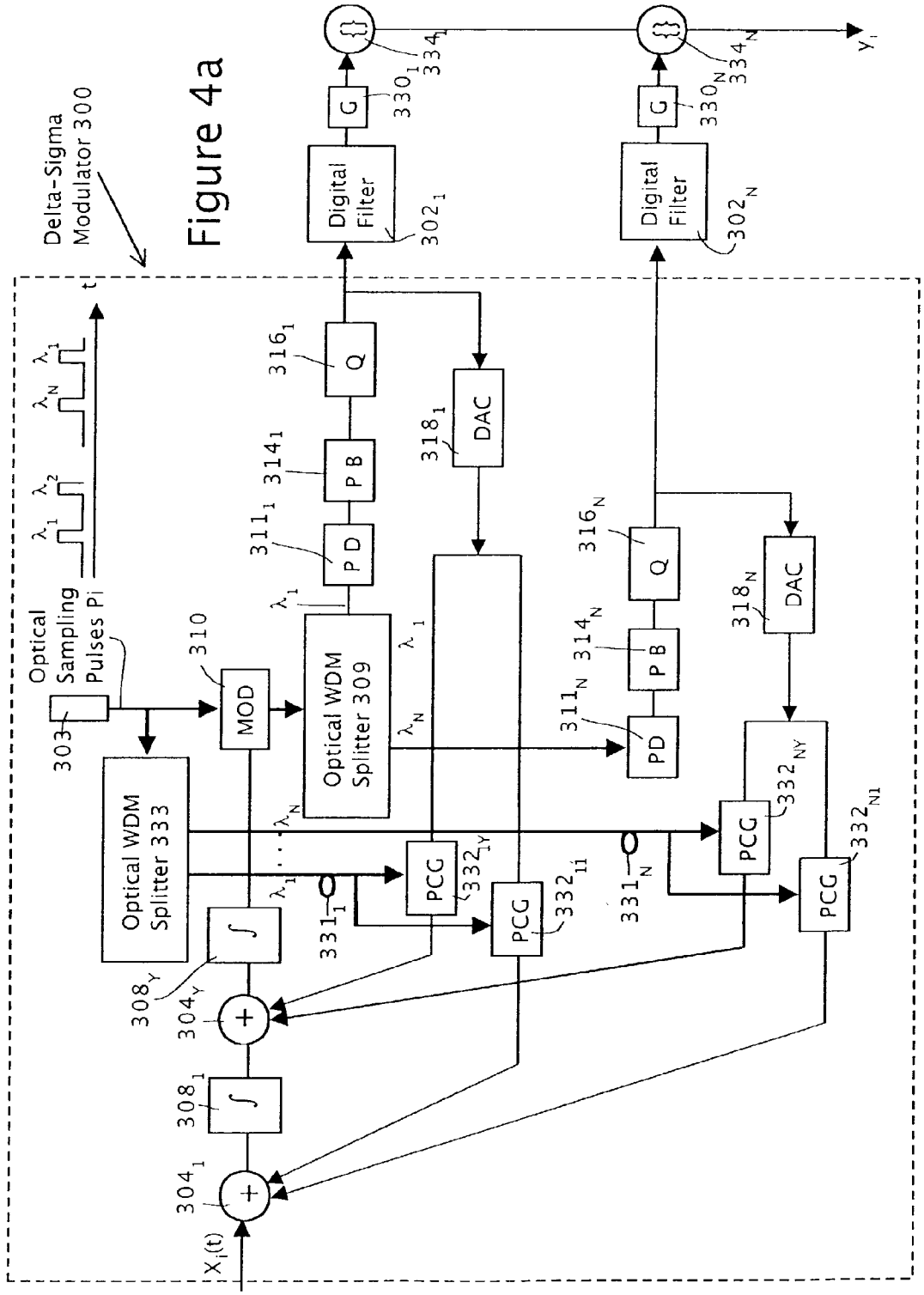
FIG. 4a illustrates an embodiment similar to the embodiment of FIG. 4, but showing one DAC element in a given channel being fed to a plurality of photoconductive gates.

An embodiment that incorporates a Y-order integrator is shown in FIG. 4 to illustrate how higher-order integrators can be combined with the time-interleaved quantizers. A higher-order (Y-order) delta-sigma modulator contains Y summing nodes $304_1 \ldots 304_Y$ and Y integrators $308_1 \ldots 308_Y$, and additionally, Y feedback paths for each channel. Each summing node 304 receives DAC outputs from all of the N parallel channels. And each channel has Y DAC elements 318 and Y photoconductive gates 332. For these devices, the first subscript refers to the channel instance (1 . . . N) and the second subscript refers to the order number (1 . . . Y). Each channel has one set of these components for each order of the modulator. The DAC outputs are connected to the various summing nodes 304 in the manner shown in FIG. 4. The photoconductive gates 332 are controlled by the appropriate optical sampling pulses, which are selected according to their wavelength, and which have been delayed appropriately so that those pulses coincide with the times that the associated DAC outputs are valid. Note that it is also possible to simplify the feedback loops of FIG. 4 by providing only one DAC 318 for each channel as shown by the embodiment of FIG. 4a. In this embodiment, the output of the DAC 318 for any given channel is fed to Y photoconductive gates 332 associated with that channel, with each gate 332 of a channel being associated with a different summing node 304. The activations of those gates 332 can be staggered in time so that the DAC output is connected to only one electrical load at a time.

These embodiments of the time-interleaved, Delta-Sigma ADC make use of an optical modulator as the photonic sampler 310. The photonic sampler 310 may be provided by the devices disclosed with reference to the devices of FIGS. 6A, 6B and 6C of U.S. patent application Ser. No. 10/281, 331 entitled "Optically Sampled Delta-Sigma Modulator" where the light is shown passing through and exiting the devices shown in FIGS. 6A, 6B and 6C of that U.S. patent application.

Figure 5:
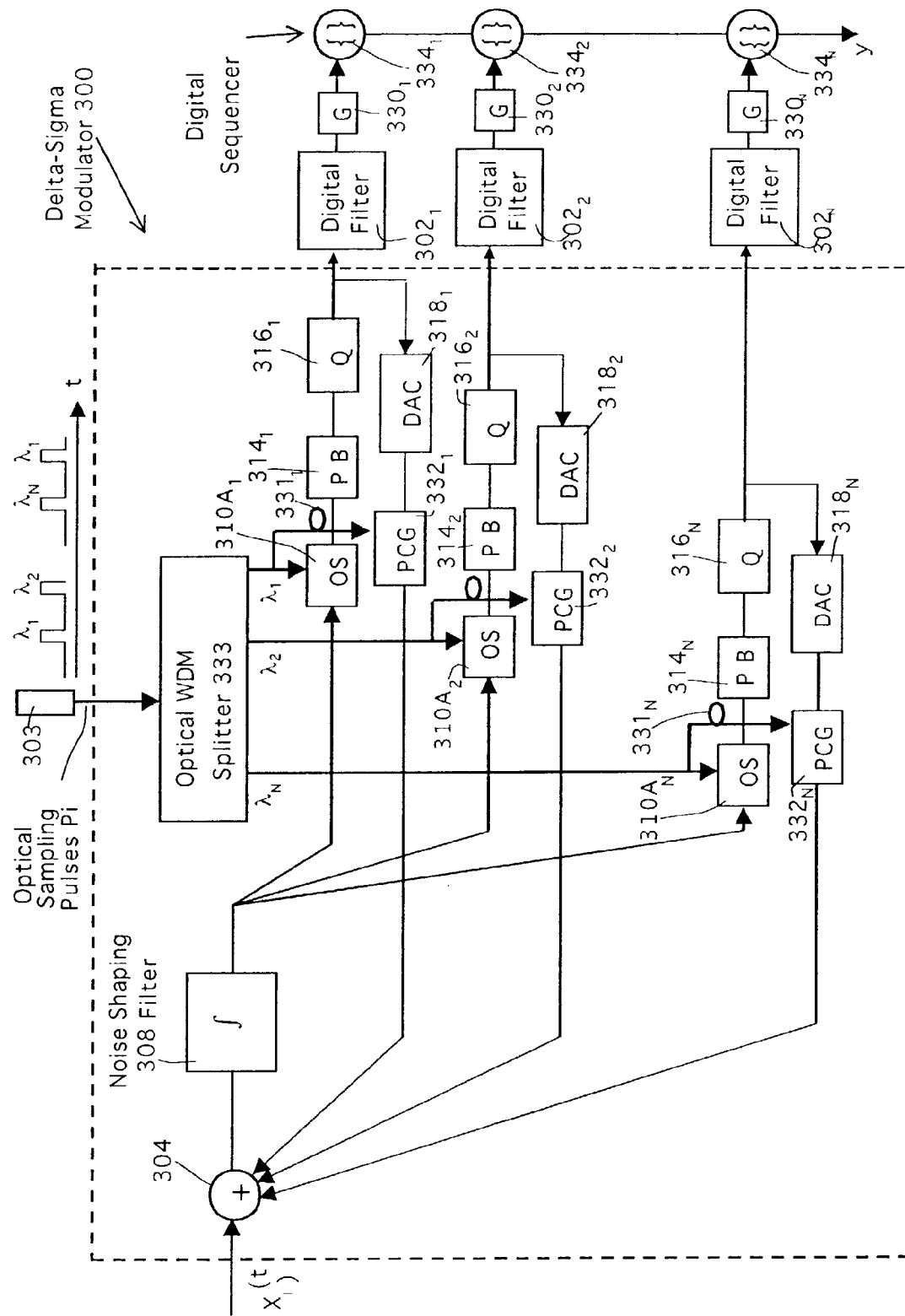
FIG. 5 illustrates another embodiment of the time-interleaved, delta-sigma analog-to-digital converter according to the present invention, with this embodiment using multiple samplers.

It is also possible to use multiple samplers that are activated by the wavelength-encoded optical sampling pulses. This approach is illustrated in FIG. 5. In this embodiment the function of the photonic sampler is combined with the detector, and collectively referred to as optoelectronic samplers $310A_1$–$310A_N$. These optoelectronic samplers $310A_1$–$310A_N$ are basically voltage sensitive photo detectors and the devices disclosed in U.S. patent application Ser. No. 10/281,331 entitled "Optically Sampled Delta-Sigma Modulator" may be used in this embodiment.

The use of high oversampling ratios in a delta-sigma ADC system is beneficial because the resolution is improved substantially compared to the performance of the sampler. An alternative embodiment likewise uses wavelength-encoded optical sampling pulses, but distributes these optical pulses, according to their wavelengths, among multiple parallel optoelectronic samplers. Each sampler then supplies an electrically sampled signal that is evaluated by its associated quantizer, which compares that signal with a reference. In a multi-sampler optically sampled delta-sigma ADC, the samplers are located after the integrator(s) 308 and before the quantizers 316. The first optoelectronic sampler $310A_1$ samples the analog output of the integrator 308 at the instance of the first pulse (that has wavelength $\lambda_1$). The second optoelectronic sampler $310A_2$ samples the analog output of the integrator at the instance of the next pulse (that has wavelength $\lambda_2$), and so on. This process continues until the Nth sampling pulse (that has wavelength $\lambda_N$). Then the cycle repeats again with the following sampling pulse (that again has wavelength $\lambda_1$). An optical wavelength-division-multiplexing (WDM) splitter 333 distributes the optical sampling pulses among the various optoelectronic samplers $310A_1$–$310A_N$. Thus, each optoelectronic sampler 310A samples only a time-sliced subset of the analog waveform output from the integrator 308.

When compared with the previous embodiments, the electrical output current of the optoelectronic samplers 310A in this embodiment replaces the electrical output current of the photodetectors 311 in the previously discussed embodiments. Note that this output is reversed in sense, compared to the output of the photodetectors 311. When the analog voltage to the optoelectronic sampler 310A is increased, its output current also is increased. However, in the previous embodiment when the analog voltage to the photonic sampler 310A is increased, the output current from the subsequent photodetector is decreased. A comparison of FIGS. 3 and 5 will further elucidate the major distinctions between these two embodiments of the invention. In FIG. 5, WDM splitter 333 distributes the optical sampling pulses to the photonic samplers 310. In FIG. 3, WDM splitter 309 distributes the previously sampled pulses (in optical form) to the photodetectors 311. In FIG. 5, multiple optoelectronic samplers $310A_1$–$310A_N$ produce multiple photocurrents. In FIG. 3, there is a single photonic sampler 310 but multiple photodetectors 311, which photodetectors 311 produce the multiple photocurrents. A second WDM splitter 333 distributes the optical sampling pulses to the photoconductive gates 332 in the embodiment of FIG. 3 whereas only a single WDM splitter 333 is used in the embodiment of FIG. 5. The common number 333 is used for both WDM splitters since they both distribute the optical sampling pulses, albeit to both optoelectronic samplers 310 and gates 332 in FIG. 5 and only to the gates 332 in FIG. 3. The other components have previously been described with reference to the other embodiments and therefore they are not described further here. The reader will note that a common numbering scheme has been used for the elements throughout the embodiments of FIGS. 3–6 to aid in an understanding the disclosed embodiments of this Time-Interleaved Delta-Sigma Analog to Digital Converter.

Figure 6:
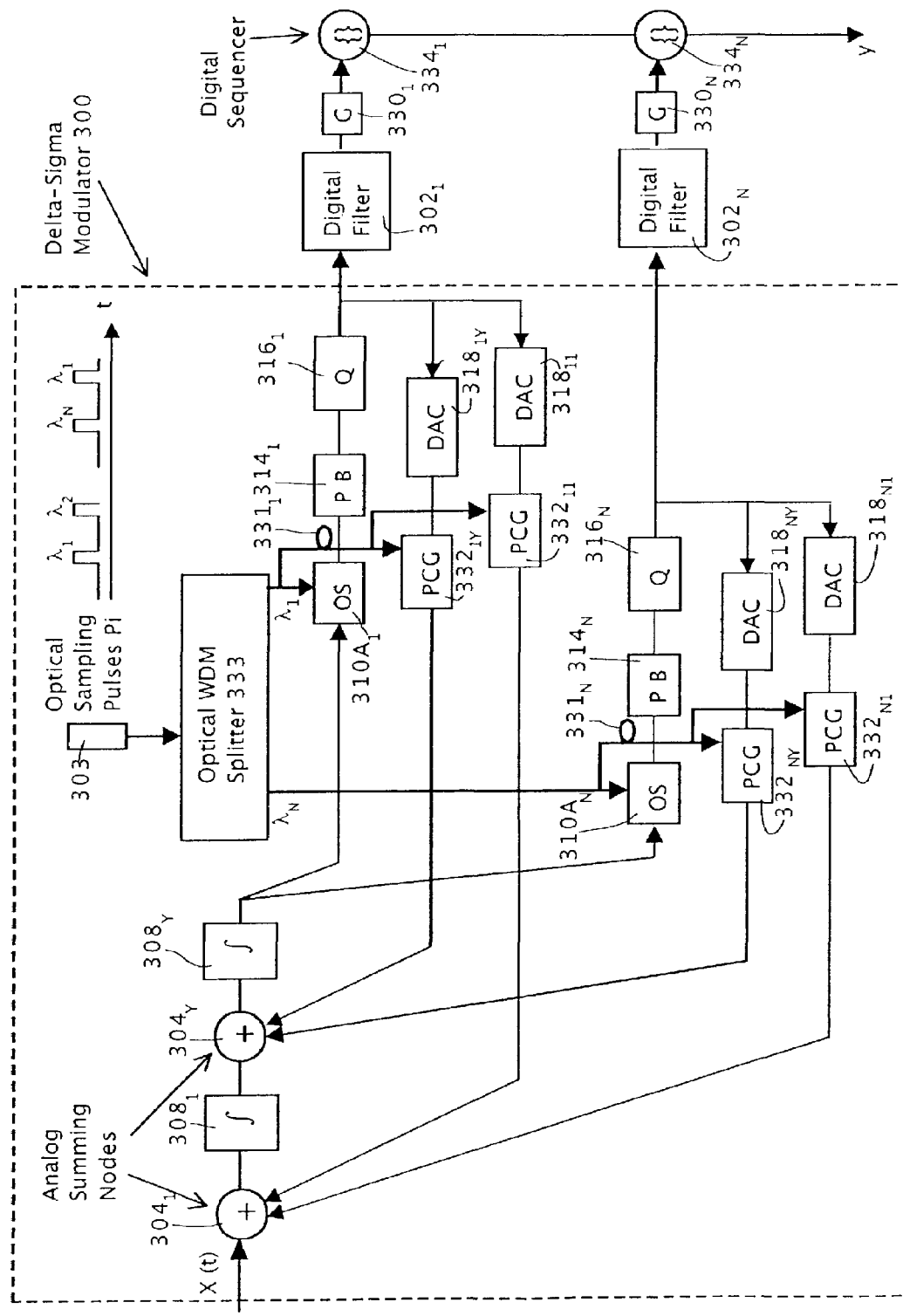
FIG. 6 illustrates yet another embodiment of the time-interleaved, delta-sigma analog-to-digital converter according to the present invention, this embodiment having a higher order (Y-order), time-interleaved, delta-sigma ADC with multiple samplers.

Higher-order delta-sigma modulators similarly can be implemented with multiple optoelectronic samplers $310A_1$–$310A_N$. That is to say, the concept of adding additional orders to the embodiment of FIG. 3 (which takes us to the embodiment of FIG. 4) can also be applied to the embodiment of FIG. 5 to yield a higher order version of that embodiment of the present invention. See FIG. 6. In such delta-sigma modulators, the multiple optoelectronic samplers are located after the final integrator 308. An implementation of a Y-order modulator having multiple optoelectronic samplers $310A_1$–$310A_N$ is illustrated in FIG. 6. Although the Y-order modulator only has two orders depicted in detail, this approach also can be applied generally to high-order modulators. Higher-order modulators have additional summing nodes 304 and additional integrators 308 which are added pairwise in a series before the optoelectronic sampler(s) 310A. Additional feedback paths, containing DAC elements 318 and photoconductive gates 332, can be added for each channel to supply the desired feedback signals to the respective summing nodes 304. One skilled in the art of delta-sigma ADCs can easily adapt the embodiments shown to higher-order modulators. As was discussed with reference to the embodiment of FIG. 4a, the number of DAC elements 318 in each feedback loop can be reduced to a single DAC element 318 by having its output feed Y gates 332.

Note that the optical sampling pulses need not be equally spaced in time. For example, the pulses of one of the wavelengths could be set to account for two sampling intervals. The digital gain element of the associated channel could then be adjusted to reflect the greater weight of that channel. The disclosed embodiments encode and select the optical sampling pulses by their different wavelengths. Other methods known in the art likewise could be used to select the sampling pulses. For example, the sampling pulses could be selected according to their temporal position. See, for example, the teachings of Hamilton and Bell noted above. The wavelength selection techniques disclosed herein simplify the equipment.

Having described the invention in connection with certain embodiments thereof, modification will now certainly suggest itself to those skilled in the art. The invention is not to be limited to the disclosed embodiments, except as is specifically required by the appended claims.

What is claimed is:

1. A delta-sigma modulator comprising:
   a node which produces a difference signal equal to a difference in magnitude between a continuous time analog input signal having a frequency F and N feedback signals generated from N digital output signals, where N is an integer number greater than one;
   an integrator, coupled with the node, which integrates the difference signal and produces an integrated signal;
   a set of N detectors;
   a sampler, which samples the integrated signal and produces a sampled integrated signal;
   a signal splitter connected with the sampler for separating the sampled integrated signal into N different outputs, the outputs of the signal splitter being coupled with the set of N detectors to supply different detectors with different sampled integrated signals to different detectors;
   a set of N quantizers, each quantizer being coupled with one of said N detectors and having a frequency response less than F, but of at least F/N, the quantizers each quantizingat least a portion of the sampled integrated signal and the set of N quantizers collectively producing the N digital output signals; and
   a set of N digital to analog modulators for converting the N digital output signals to generate the N feedback signals applied to said node.

2. The delta-sigma modulator of claim 1 wherein the sampler is a photonic sampler having (i) an optical output coupled with the signal splitter, (ii) an electrical input coupled with the integrator, and (iii) an optical input for receiving optical pulses from an optical pulse generating device, the photonic sampler modulates the amplitude of optical pulses derived from the optical pulse generating device according to the integrated signal.

3. The delta-sigma converter of claim 2 where the optical pulse generating device is a laser.

4. The delta-sigma modulator of claim 2 wherein the optical pulses are encoded by having different wavelengths associated therewith.

5. The delta-sigma modulator of claim 4 wherein the signal splitter is a wavelength-division-multiplexing (WDM) splitter for separating the sampled integrated signal into N different outputs according to their wavelengths, the outputs of the wavelength-division-multiplexing (WDM) splitter being coupled with the set of N detectors to deliver different wavelength separated sampled integrated signals to different detectors.

6. The delta-sigma modulator of claim 2 wherein the detectors produce electrical pulses which correspond to the sampled integrated signal produced by the sampler and wherein the quantizers quantize the electrical pulses produced by associated ones of said detectors.

7. The delta-sigma modulator of claim 1 wherein each of the digital to analog modulators is gated by an associated gate connected in series between each of the digital to analog modulators and said node, the gates being controlled by optical pulses supplied by a second signal splitter and wherein the sampler and the second signal splitter are supplied optical pulses from an optical pulse generating device.

8. The delta-sigma modulator of claim 7 wherein the second signal splitter is a wavelength-division-multiplexing (WDM) splitter for sequencing the optical pulses for controlling the gates.

9. The delta-sigma modulator of claim 8 wherein the gates are photoconductive gates controlled by optical pulses coupled from the second wavelength-division-multiplexing (WDM) splitter.

10. The delta-sigma modulator of claim 7, the delta-sigma modulator having an order greater than one and further comprising:
    at least one additional node, each at least one additional node produces a difference signal equal to a difference in magnitude between an integrated signal produced by a preceding integrator and N feedback signals generated from the N digital output signals;
    an additional integrator associated with each at least one additional node, each additional integrator being coupled with its associated at least one additional node for integrating the difference signal produced by the associated at least one additional node and producing an associated integrated signal, each of all the nodes and each of all the integrators being connected as a series of node/integrator pairs; and
    at least one additional set of N gates, the number of sets of N gates equalling the number of node/integrator pairs in said series,
    wherein the sampler samples the integrated signal produced by a last integrator of said series of integrator/node pairs.

11. The delta-sigma modulator of claim 1, the delta-sigma modulator having an order greater than one and further comprising:
    at least one additional node, each at least one additional node produces a difference signal equal to a difference in magnitude between an integrated signal produced by a preceding integrator and N feedback signals generated from the N digital output signals; and
    an additional integrator associated with each at least one additional node, each additional integrator being coupled with its associated at least one additional node for integrating the difference signal produced by the associated at least one additional node and producing an associated integrated signal, each of all the nodes and each of all the integrators being connected as a series of node/integrator pairs,
    wherein the sampler samples the integrated signal produced by a last integrator of said series of node/integrator pairs.

12. The delta-sigma modulator of claim 11 wherein the sampler is a photonic sampler having (i) an optical output coupled with the signal splitter, (ii) an electrical input coupled with the last integrator, and (iii) an optical input for receiving optical pulses from an optical pulse generated device, wherein the photonic sampler modulates the amplitude of optical pulses derived from the optical sampling pulse generated device according to the integrated signal produced by the last integrator.

13. The delta-sigma converter of claim 12 wherein such optical pulse generating device is a laser.

14. The delta-sigma modulator of claim 12 wherein the optical pulses are encoded by having different wavelengths associated therewith.

15. The delta-sigma modulator of claim 14 wherein the signal splitter is a wavelength-division-multiplexing (WDM) splitter for separating the optical output of the photonic sampler into N different outputs according to the wavelengths, the outputs of the wavelength-division-multiplexing (WDM) splitter being coupled with the set of N detectors to supply different detectors with different wavelength separated sampled signals.

16. The delta-sigma modulator of claim 15 wherein each of the digital to analog modulators is gated by one or more associated gates connected in series between each of the digital to analog modulators and an associated node of the series of node/integrator pairs, the gates being controlled by optical pulses supplied by a second wavelength-division-multiplexing(WDM) splitter.

17. The delta-sigma modulator of claim 16 wherein the sampler and the second wavelength-division-multiplexing (WDM) splitter are supplied optical pulses by a common optical pulse generating device.

18. The delta-sigma modulator of claim 17 wherein the gates are photoconductive gates controlled by said optical pulses from said common optical pulse generating device.

19. A delta-sigma converter comprising:
a delta-sigma modulator as claimed in claim 1;
a set of N digital filters connected with said set of N quantizers;
a set of N generators connected with said set of N digital filters; and
a digital sequencer connected with said set of N generators.

20. A delta-sigma converter comprising:
a delta-sigma modulator as claimed in claim 9;
a set of N digital filters connected with said set of N quantizers;
a set of N generators connected with said set of N digital filters; and
a digital sequencer connected with said set of N generators.

21. A delta-sigma modulator having N channels and being of a Yth order, with Y being an integer equal to or greater than one and N being an integer equal to or greater than 2, the modulator comprising:
a set of Y node/integrator pairs connected in a series, the nodes of which produce a difference signal equal to the difference in magnitude between a continuous time analog input signal having a frequency F and N feedback signals generated from N digital output signals and the integrators of which are coupled with an associated node and integrate the difference signal from the associated node to produce an integrated signal for the associated node/integrator pair;
a set of N detectors;
a sampler, which samples the integrated signal from a last node/integrator pair in said set and produces a sampled integrated signal;
a signal splitter connected with the sampler for separating the sampled integrated signal into N different outputs, the outputs being coupled to the set of N detectors to supply different detectors with different sampled integrated signals;
a set of N quantizers, each quantizer being coupled with one of said detectors and having a frequency response less than F, but of at least F/N, the quantizers each quantizing a portion of the sampled integrated signal and collectively producing the N digital output signals; and
at least one set of N digital to analog converters for converting the N digital output signals to generate the N feedback signals to each of the Y nodes.

22. The delta-sigma modulator of claim 21 wherein said optical pulse generating device is a laser.

23. The delta-sigma modulator of claim 21 wherein the sampler is a photonic sampler having (i) an optical output coupled with said signal splitter, (ii) an electrical input coupled with a last one of the node/integrator pairs, and (iii) an optical input for receiving optical pulses from an optical pulse generating device, the photonic sampler modulating the amplitude of the optical pulses derived from the optical pulse generating device according to the integrated signal of the last one of the node/integrator pairs.

24. The delta-sigma modulator of claim 23 wherein the optical pulses are encoded by having different wavelengths associated therewith.

25. The delta-sigma modulator of claim 24 wherein the signal splitter is a wavelength-division-multiplexing (WDM) splitter for separating the sampled integrated signal into N different outputs according to their wavelengths, the outputs of the wavelength-division-multiplexing (WDM) splitter being coupled with the set of N detectors to deliver different wavelength separated sampled integrated signals to different detectors.

26. The delta-sigma modulator of claim 25 further including Y sets of N gates for gating N·Y feedback signals onto respective nodes of the set of Y node/integrator pairs so that each node of the Y node/integrator pairs receives N feedback signals, with each one of said at least one set of N digital to analog convertors being associated with up to Y gates.

27. The delta-sigma modulator of claim 26 wherein said Y sets of N gates are controlled by optical pulses supplied by a second wavelength-division-multiplexing (WDM) splitter.

28. The delta-sigma modulator of claim 27 wherein the sampler and the second wavelength-division-multiplexing (WDM) splitter are supplied optical pulses from the optical pulse generating device.

29. The delta-sigma modulator of claim 28 wherein said Y sets of N gates are photoconductive gates controlled by said optical pulses from said optical pulse generating device.

30. A delta-sigma modulator comprising:
a node which produces a difference signal equal to the difference in magnitude between a continuous time analog input signal having a frequency F and N feedback signals generated from N digital output signals, where N is an integer larger than one;
an integrator, coupled with the node, which integrates the difference signal and produces an integrated signal;
a set of N optoelectronic samplers, which sample the integrated signal and produce a set of sampled integrated signals;
a signal splitter connected to the set of N optoelectronic samplers, the signal splitter separating optical pulses supplied by an optical pulse generating device into N different outputs, the outputs being coupled with the set of N optoelectronic samplers to supply different samplers with different pulses;
a set of N quantizers, each quantizer being coupled with one of said samplers and having a frequency response less than F, but of at least F/N, the set of N quantizers each quantizing one sampled integrated signal from the set of sampled integrated signals and collectively producing the N digital output signals; and a set of N digital to analog modulators for converting a respective digital output signal of said N digital output signals to one of said N feedback signals for application to the node.

31. The delta-sigma modulator of claim 30 wherein the optical pulse generating device is a laser.

32. The delta-sigma modulator of claim 30 wherein:
(i) each optoelectronic sampler of the set of N optoelectronic samplers has an electrical output coupled with an associated quantizer of the set of N quantizers,
(ii) an electrical input coupled with the integrator, and
(iii) an optical input for receiving optical pulses from the signal splitter, each optoelectronic sampler modulating the amplitude of the optical pulses derived from the signal splitter according to the integrated signal.

33. The delta-sigma modulator of claim 32 wherein the optical pulses from the optical pulse generating device are encoded by having different wavelengths associated therewith.

34. The delta-sigma modulator of claim 33 wherein the signal splitter is a wavelength-division-multiplexing (WDM) splitter for separating the optical pulses into N different outputs according to their wavelengths, the outputs of the wavelength-division-multiplexing (WDM) splitter being coupled with the set of N optoelectronic samplers to supply different optoelectronic samplers with different wavelength separated sampled signals.

35. The delta-sigma modulator of claim 30 wherein each of the digital to analog modulators is gated by an associated gate connected in set between each of the digital to analog modulators and said node, the gates being controlled by optical pulses supplied by said signal splitter.

36. The delta-sigma modulator of claim 35 wherein the signal splitter is a wavelength-division-multiplexing (WDM) splitter for sequencing the optical pulses for controlling the gates.

37. The delta-sigma modulator of claim 36 wherein the gates are photoconductive gates controlled by optical pulses coupled from the wavelength-division-multiplexing (WDM) splitter.

38. The delta-sigma modulator of claim 30, the delta-sigma modulator having an order greater than one and further comprising:
at least one additional node, each at least one additional node produces a difference signal equal to the difference in magnitude between an integrated signal produced by a preceding integrator and N feedback signals generated from N digital output signals; and
an additional integrator associated with each at least one additional node, each additional integrator being coupled with its associated at least one additional node for integrating the difference signal generated by the associated additional node and producing an associated integrated signal, each of all the nodes and each of all the integrators being connected as a set of node/integrator pairs, wherein the sampler samples the integrated signal produced by a last integrator of said set of node/integrator pairs.

39. The delta-sigma modulator of claim 38 wherein:
(i) each optoelectronic sampler of the set of N optoelectronic samplers has an electrical output coupled with an associated quantizer of the set of N quantizers,
(ii) an electrical input coupled with the last integrator, and
(iii) an optical input for receiving optical pulses from the signal splitter, each optoelectronic sampler modulating the amplitude of the optical pulses derived from the signal splitter according to the integrated signal.

40. The delta-sigma modulator of claim 39 wherein the optical pulses from the optical pulse generating device are encoded by having different wavelengths associated therewith.

41. The delta-sigma modulator of claim 40 wherein the signal splitter is a wavelength-division-multiplexing (WDM) splitter for separating the optical pulses into N different outputs according to their wavelengths, the outputs of the wavelength-division-multiplexing (WDM) splitter being coupled with the set of N optoelectronic samplers to deliver different wavelength separated pulses to different samplers.

42. The delta-sigma modulator of claim 38 further comprising at least one additional set of gates for gating the digital to analog modulators, the number of additional sets of gates for gating each digital to analog modulator equaling the number of node/integrator pairs in said set wherein each associated gate is connected in set between one of the digital to analog modulators and an associated one of said nodes, each digital to analog modulator being connected to a number of gates equaling the number of node/integrator pairs.

43. The delta-sigma modulator of claim 42 wherein the signal splitter is a wavelength-division-multiplexing (WDM) splitter for sequencing the optical pulses for controlling the gates.

44. The delta-sigma modulator of claim 43 wherein the gates are photoconductive gates controlled by optical pulses coupled from the wavelength-division-multiplexing (WDM) splitter.

45. A delta-sigma modulator having N channels and being of a Yth order, with Y being an integrator equal or greater than one and N being an integer equal to or greater than 2, the modulator comprising:
a set of Y node/integrator pairs connected in a set, the nodes of which produce a difference signal equal to the difference in magnitude between a continuous time analog input signal having a frequency F and N feedback signals generated from N digital output signals and the integrators of which are coupled with an associated node and integrate the difference signal from the associated node to produce an integrated signal for a node/integrator pair;
a set of N optoelectronic samplers each of which samples the integrated signal from a last node/integrator pair in said set and produces a sampled integrated signal;
a signal splitter connected to the set of N optoelectronic samplers, the signal splitter for separating the optical pulses supplied by an optical pulse generating device into N different outputs, the outputs being coupled with at least the set of N optoelectronic samplers to supply different optoelectronic samplers with different pulses;
a set of N quantizers, each quantizer being coupled with one of said samplers and having a frequency response less than F, but of at least F/N, the quantizers each quantizing a portion of the sampled integrated signal and said set of N quantizers collectively producing the N digital output signals; and
at least one set of N digital to analog converters for converting a respective digital output signal from the N digital output signals into a corresponding one of said N feedback signals for application to each of said nodes.

46. The delta-sigma modulator of claim 45 wherein:
(i) each optoelectronic sampler of the set of N optoelectronic samplers has an electrical output coupled with an associated quantizer of the set of N quantizers,
(ii) an electrical input coupled with the last node/integrator pair in said set, and (iii) an optical input for receiving optical pulses from the signal splitter, the optoelectronic sampler modulating the amplitude of the optical pulses derived from the signal splitter according to the integrated signal of the last node/integrator pair in said set.

47. The delta-sigma modulator of claim 46 wherein the optical pulses from the optical pulse generating device are encoded by having different wavelengths associated therewith.

48. The delta-sigma modulator of claim 47 wherein the optical pulse generating device is a laser.

49. The delta-sigma modulator of claim 47 wherein the signal splitter is a wavelength-division-multiplexing (WDM) splitter for separating the optical pulses into N different outputs according to their wavelengths, the outputs of the wavelength-division-multiplexing (WDM) splitter being coupled with the set of N optoelectronic samplers to supply different optoelectronic samplers with different wavelength separated pulses.

50. The delta-sigma modulator of claim 45 further including Y sets of N gates for gating N·Y feedback signals onto respective nodes of the set of Y node/integrator pairs so that each node of the Y node/integrator pairs receives N feedback signals with each one of said at least one set of N digital to analog convertors being associated with up to Y gates.

51. The delta-sigma modulator of claim 50 wherein the said Y sets of N gates are controlled by optical pulses supplied by a wavelength-division-multiplexing (WDM) splitter.

52. The delta-sigma modulator of claim 51 wherein the said Y sets of N gates are photoconductive gates controlled by said optical pulses from said optical pulse generating device.

53. The delta-sigma modulator of claim 51 wherein the sampler and the wavelength-division-multiplexing (WDM) splitter are supplied optical pulses from said optical pulse generating device.

54. A method for increasing a sampling rate of an optical delta-sigma modulator having at least one channel comprising:
adding one or more channels to said optical delta-sigma modulator, wherein each channel in said one or more channels comprises a photodetector, a quantizer connected with said photodetector and a digital to analog converter connected with said quantizer;
addressing said channels in a time-interleaved manner such that each channel handles a subset of an input to said optical delta-sigma modulator; and
supplying an output of each of said channels to a first node.

55. The method of claim 54 wherein said optical delta-sigma modulator is of a Yth order, with Y being an integer greater than or equal to one, said optical delta-sigma modulator having a set of Y nodes, wherein the output of each of said channels is supplied to each node in said set of Y nodes, said first node being included in said set of Y nodes.

56. The method of claim 54 further comprising connecting at least one photoconductive gate with each digital to analog converter in each of said channels.

57. A method for improving a delta-sigma modulator having at least one channel comprising:
integrating an analog difference signal to produce an integrated analog signal, wherein the analog difference signal is equal to a difference in magnitude between a continuous time analog input signal having a frequency F and N feedback signals generated from N digital output signals, where N is an integer number greater than one;
optically sampling said integrated analog signal to produce an optically sampled integrated signal;
time-interleaving the optically sampled integrated signal among a plurality of channels; and
combining an output of each of said plurality of channels into a first node.

58. The method of claim 57 wherein said delta-sigma modulator is of a Yth order, with Y being an integer greater than or equal to one, said delta-sigma modulator having a set of Y nodes, wherein the output of each of said plurality of channels is supplied to each node in said set of Y nodes, said first node being included in said set of Y nodes.

59. The method of claim 57 further comprising associating at least one photoconductive gate with each of said plurality of channels.

60. A method of providing an improved optical delta-sigma modulator comprising:
subtracting an analog signal and N feedback signals, said N feedback signals being generated from N channels to produce a first difference signal wherein N is an integer greater than or equal to two;
integrating said first difference signal to produce an integrated signal;
splitting said integrated signal into said N channels;
optically sampling said integrated signal in each of said N channels to produce N optically sampled signals;
quantizing each of said N optically sampled signals to produce N quantized signals; and
generating said N feedback signals from said N quantized signals.

61. The method of claim 60 wherein said optical delta-sigma modulator is of Yth order, with Y being an integer greater than or equal to one further comprising:
providing said N feedback signals to each node in a set of Y nodes, said set of Y nodes being connected in series; and
inserting an integrator between each of said Y nodes in said set of Y nodes resulting in Y node/integrator pairs.

62. The method of claim 60 further comprising gating in a time-interleaved manner each of said N feedback signals.

63. An optical delta-sigma modulator comprising:
a set of N channels, wherein each channel in said set of N channels comprises
a photodetector, a quantizer connected with said photodetector and a digital to analog converter connected with said quantizer, each channel in said set of N channels having an input and an output, wherein N is an integer greater than or equal to two;
a splitter having a plurality of splitter outputs, each output of said plurality of splitter outputs coupled with an input of an associated channel in said set of N channels, said splitter for splitting an input signal to said optical delta-sigma modulator into said set of N channels such that each channel handles a subset of said input signal; and
a combiner connected with said outputs of said set of N channels for combining said subsets of said input signal.

64. The optical delta-sigma modulator of claim 63 wherein said optical delta-sigma modulator is of a Yth order, with Y being an integer greater than or equal to one, said optical delta-sigma modulator having a set of Y nodes, wherein the output of each of being included in said set of Y nodes.

65. The optical delta-sigma modulator of claim 63 further comprising at least one photoconductive gate connected with each digital to analog converter in each channel of said set of N channels.

* * * * *